United States Patent
Maxim (10) Patent No.: US 7,599,676 B2
(45) Date of Patent: Oct. 6, 2009

(54) POWER CONSUMPTION REDUCTION TECHNIQUES FOR AN RF RECEIVER IMPLEMENTING A MIXING DAC ARCHITECTURE

(75) Inventor: Adrian Maxim, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 465 days.

(21) Appl. No.: 11/669,769

(22) Filed: Jan. 31, 2007

(65) Prior Publication Data

US 2008/0181336 A1   Jul. 31, 2008

(51) Int. Cl.
H04B 1/06 (2006.01)
(52) U.S. Cl. .................................. 455/258; 455/343.1
(58) Field of Classification Search ............ 455/188.1, 455/188.2, 190.1, 255, 256, 257, 258, 259, 455/260, 265, 323, 334, 343.1
See application file for complete search history.

(56) References Cited

U.S. PATENT DOCUMENTS

| | | | |
|---|---|---|---|
| 4,346,477 A | 8/1982 | Gordy | |
| 4,464,770 A | 8/1984 | Maurer et al. | |
| 4,626,803 A | 12/1986 | Holm | |
| 4,653,117 A | 3/1987 | Heck | |
| 4,803,700 A | 2/1989 | Dewey et al. | |
| 4,817,167 A | 3/1989 | Gassmann | |
| 4,926,130 A | 5/1990 | Weaver | |
| 4,944,025 A | 7/1990 | Gehring | |
| 4,975,699 A | 12/1990 | Frey | |
| 5,251,218 A | 10/1993 | Stone et al. | |
| 5,263,194 A | 11/1993 | Ragan | |
| 5,440,587 A | 8/1995 | Ishikawa et al. | |
| 5,544,200 A | 8/1996 | An | |

(Continued)

FOREIGN PATENT DOCUMENTS

WO    WO 87/01531    3/1987

OTHER PUBLICATIONS

"A GSM/GPRS Mixed Signal Baseband IC," Redmond, David. et al., IEEE Int'l. Solid State Circuits Conference (ISSCC), Digest of Technical Papers, XP010585465, Feb. 2002, Sec. 3.6.

(Continued)

Primary Examiner—Blane J Jackson
(74) Attorney, Agent, or Firm—Polansky & Associates, PLLC (57) ABSTRACT

A receiver (100) includes a mixing digital-to-analog converter (DAC) (120), a direct digital frequency synthesizer (DDFS) (116), and a clock circuit (114). The mixing DAC (120) includes a radio frequency (RF) transconductance section (124) and a switching section (128). The RF transconductance section (124) includes an input configured to receive an RF signal. The switching section is coupled to the RF transconductance section (124) and includes inputs, configured to receive bits associated with a digital local oscillator (LO) signal, and an output. The DDFS (116) includes outputs, configured to provide the bits associated with the digital LO signal to the inputs of the switching section (128), and a first clock input, configured to receive a first clock signal that sets a sample rate for the digital LO signal The clock circuit (114) is configured to provide the first clock signal to the first clock input of the DDFS (116) at a frequency that is based on a selected channel.

20 Claims, 9 Drawing Sheets

U.S. PATENT DOCUMENTS

| | | |
|---|---|---|
| 5,640,698 A | 6/1997 | Shen et al. |
| 5,826,180 A | 10/1998 | Golan |
| 5,828,955 A | 10/1998 | Lipowski |
| 5,867,535 A | 2/1999 | Philips et al. |
| 6,154,640 A | 11/2000 | Itoh et al. |
| 6,249,179 B1 | 6/2001 | Maalej et al. |
| 6,330,290 B1 | 12/2001 | Glas |
| 6,785,529 B2 | 8/2004 | Ciccarelli et al. |
| 6,829,311 B1 | 12/2004 | Riley |
| 6,867,693 B1 | 3/2005 | Radin |
| 6,963,734 B2 | 11/2005 | Sorrells et al. |
| 7,358,885 B2 * | 4/2008 | Maxim et al. ............... 341/144 |
| 7,447,493 B2 * | 11/2008 | Johnson ..................... 455/334 |
| 7,548,742 B2 * | 6/2009 | Johnson ..................... 455/313 |
| 2003/0223525 A1 | 12/2003 | Momtaz et al. |
| 2004/0002318 A1 | 1/2004 | Kerth et al. |
| 2004/0121747 A1 * | 6/2004 | Shen et al. ................ 455/141 |
| 2005/0003785 A1 * | 1/2005 | Jackson et al. ............. 455/260 |
| 2005/0239499 A1 | 10/2005 | Oosawa et al. |
| 2005/0266818 A1 * | 12/2005 | Johnson et al. ............ 455/260 |
| 2008/0181340 A1 * | 7/2008 | Maxim ...................... 375/346 |

OTHER PUBLICATIONS

"Optimized Digital Singal Processing for Flexible Receivers," Brückmann, Dieter et al., IEEE Int'l (ICASSP), XP010804418, 2002, pp. IV-3765-3766.

* cited by examiner

POWER CONSUMPTION REDUCTION TECHNIQUES FOR AN RF RECEIVER IMPLEMENTING A MIXING DAC ARCHITECTURE

FIELD OF THE DISCLOSURE

The present disclosure is generally directed to a radio frequency (RF) receiver and, more particularly, to techniques for reducing power consumption of an RF receiver that implements a mixing digital-to-analog converter (DAC) architecture.

BACKGROUND

Broadband radio frequency (RF) receivers that operate at high clock frequencies have relatively high power requirements Moreover, broadband RF receivers that implement mixing digital-to-analog converter (DAC) architectures also have relatively high power requirements due to, at least in part, the relatively high clock frequency, e.g., 3 GHz, that has been used to generate digital local oscillator (LO) signals for the receivers and the relatively large number of data lines (DAC bits) required to achieve a relatively high mixing DAC linearity In such RF receivers, the mixing DAC has included an RF transconductance section and a switching section. The RF transconductance section has included an input that received an RF signal and an output that provided an RF current signal The switching section has been coupled to the RF transconductance section and has included inputs that received bits associated with the digital LO signal, which has been provided at outputs of a direct digital frequency synthesizer (DDFS) based on a single frequency clock signal. The switching section has mixed the RF current signal with the digital LO signal to provide an analog output signal at an output of the switching section. The single frequency clock signal has set a sample rate for the digital LO signal, which has been based on a sampled sine wave. Unfortunately, RF receivers that employ a single high frequency clock signal to set a sample rate for a DDFS provided digital LO signal have relatively high power requirements.

What is need is a technique for reducing power consumption in an RF receiver that implements a mixing digital-to-analog converter (DAC) architecture.

SUMMARY

According to one embodiment, a receiver includes a mixing digital-to-analog converter (DAC), a direct digital frequency synthesizer (DDFS), and a clock circuit. The mixing DAC includes a radio frequency (RF) transconductance section and a switching section. The RF transconductance section includes an input configured to receive an RF signal and an output configured to provide an RF current signal. The switching section is coupled to the RF transconductance section and includes inputs, configured to receive bits associated with a digital local oscillator (LO) signal, and an output The switching section is configured to mix the RF current signal with the digital LO signal to provide an analog output signal at the output of the switching section. The DDFS includes outputs, configured to provide the bits associated with the digital LO signal, and a first clock input, configured to receive a first clock signal that sets a sample rate for the digital LO signal. The clock circuit is configured to provide the first clock signal to the first clock input of the DDFS at a frequency that is based on a selected channel.

According to another embodiment, a receiver includes a mixing digital-to-analog converter (DAC), a direct digital frequency synthesizer (DDFS), and a clock circuit. The mixing DAC includes a radio frequency (RF) transconductance section and a switching section. The RF transconductance section includes an input configured to receive an RF signal and an output configured to provide an REF current signal The switching section is coupled to the RF transconductance section and includes inputs configured to receive bits associated with a digital local oscillator (LO) signal and an output. The switching section is configured to mix the RF current signal with the digital LO signal to provide an analog output signal at the output of the switching section. The DDFS includes outputs, configured to provide the bits associated with the digital LO signal, and a first clock input, configured to receive a first clock signal that sets a sample rate for the digital LO signal. The clock circuit is configured to provide the first clock signal to the first clock input of the DDFS. The digital LO signal is based on a sampled signal whose number of samples is based on a selected channel.

According to yet another embodiment, a technique of reducing power consumption of a receiver is disclosed. A radio frequency (RF) signal is received at a first input of a mixing digital-to-analog converter (DAC). The first input is associated with an RF transconductance section of the mixing DAC. A frequency of a first clock signal is set based on a selected channel. A direct digital frequency synthesizer (DDFS) is clocked with the first clock signal. The DDFS provides a digital local oscillator (LO) signal based, at least in part, on the first clock signal, which provides a sample rate for the digital LO signal. Bits of the digital LO signal are provided to second inputs of the mixing DAC. The second inputs are associated with a switching section of the mixing DAC.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items.

DETAILED DESCRIPTION

In general, single-path constant clock frequency direct digital frequency synthesizer (DDFS) driven mixing digital-to-analog converters (DACs) provide broadband radio frequency (RF) receivers having relatively good harmonic rejection over an entire television (TV) band, albeit at the price of relatively high power dissipation. According to various aspects of the present invent, a reduced power DDFS driven mixing DAC can be achieved by reducing a frequency of a DDFS clock signal for at least some channels. Further, power consumption of the RF receiver may also be reduced by designing the receiver to avoid large spurs that would fall inside the TV band (e.g., 40 to 860 MHz). As used herein, a "radio frequency" signal means an electrical signal conveying useful information and having a frequency from about 3 kilohertz (kHz) to thousands of gigahertz (GHz), regardless of the medium through which such signal is conveyed. Thus, an RF signal may be transmitted through air, free space, coaxial cable, fiber optic cable, etc. As used herein, the term "coupled" includes both a direct electrical connection between elements or blocks and an indirect electrical connection provided by intervening elements or blocks.

According to one or more aspects of the present invention, a single low-phase noise inductive capacitive-voltage controlled oscillator (LC-VCO), having a limited tuning range, may be implemented in conjunction with a phase locked loop (PLL) and an output divider to provide an adjustable frequency clock signal for a direct digital frequency synthesizer (DDFS). Alternatively, multiple LC-VCOs may be implemented in conjunction with a PLL and a feedback divider to provide a relatively wide range adjustable frequency clock signal for a DDFS. In either case, reducing a frequency of the DDFS clock signal for selected channels reduces power consumption of an associated RF receiver that employs a mixing DAC architecture Another technique to reduce power in a mixing DAC-based RF receiver utilizes a dual local oscillator (LO) synthesizer configuration In this configuration, for a first band, e.g. a very high frequency (VHF) band, which has LO harmonic issues, a DDFS based LO signal may be utilized. For a second band, e.g., an ultra high frequency (UHF) band, that does not have LO harmonic issues, a standard square wave LO signal may be utilized Using a square wave LO signal for the UHF band while providing relatively high immunity to out-of-band blockers, e.g., blockers attributable to cell phones and wireless local area networks (WLANs), usually requires a relatively high rejection ratio filter to be placed between an LNA and mixer. Alternatively, a high rejection TV band selector filter may be connected in front of a tuner to strongly attenuate out-of-band blockers In one embodiment, two LO signals, e.g., a sampled sine wave provided by a DDFS and a square wave provided by an in-phase/quadrature (I/Q) generator, are multiplexed to selectively drive a mixing DAC. Alternatively, a DDFS may be used to generate either a sampled sine LO signal or a square wave LO signal. In general, using the DDFS to generate either a sampled sine wave LO signal or a square wave LO signal results in a less complex circuit. However, the less complex circuit usually requires a higher DDFS clock frequency. To reduce power consumption of a DDFS driven mixing DAC, a coarse sample-and-hold approach may be implemented, as opposed to generating a sampled LO sine wave using a relatively high sampling frequency In this case, the LO band is split into several sub-bands. The lowest sub-band may require up to eleventh-order LO harmonic rejection, which usually requires at least a 10-point sampled LO signal. It should be appreciated that at higher frequencies, less harmonic rejection is usually required and, therefore, a lower number of equally spaced sample points may be employed For LO frequencies higher than one-half the maximum value, $f_{LOmax}/2$, even the 2LO component falls out-of-band and, as such, LO harmonics issues may be essentially ignored when a front-end TV selector filter is employed. In this case, a standard square wave LO signal can be used to drive all the bits of the mixing DAC and the mixing DAC essentially operates like a standard commutating mixer In general, reducing the number of sampled sine wave points stored in a look-up table and decreasing a frequency of a DDFS clock signal results in a significant reduction in power consumption for an associated RE receiver.

Figure 1:
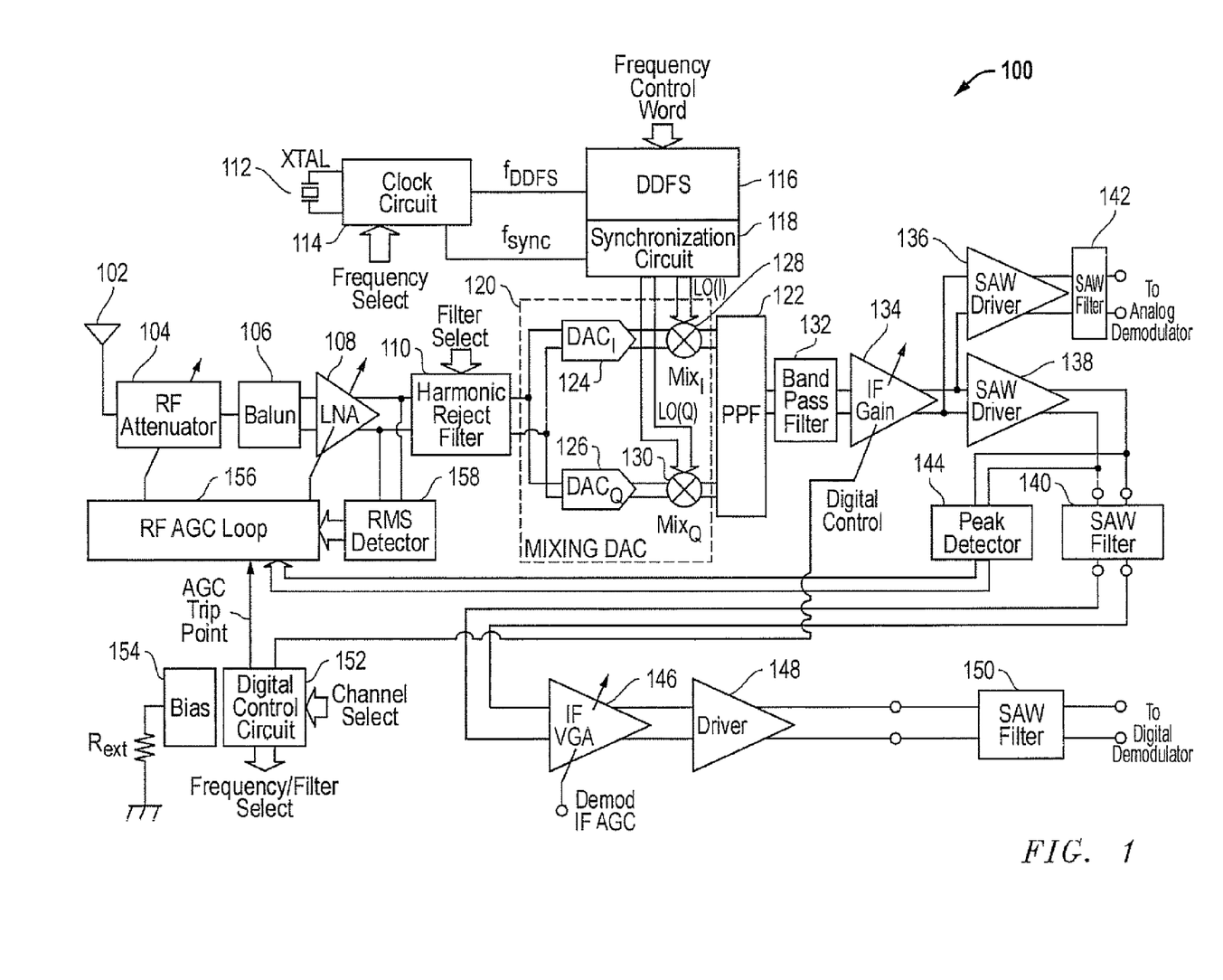
FIG. 1 is an electrical diagram, in block and schematic form, of a relevant portion of a radio frequency (RF) receiver that implements a mixing digital-to-analog converter (DAC), configured according to an embodiment of the present invention.

With reference to FIG. 1, an exemplary hybrid terrestrial/cable analog/digital television (TV) receiver (tuner) 100 is illustrated. The receiver 100 implements a direct digital frequency synthesizer (DDFS) 116 that drives a mixing digital-to-analog converter (DAC) 120, via a synchronization circuit 118, with a digital local oscillator (LO) signal. The synchronization circuit 118, which may include a master-slave latch structure and buffers, ensures that bits associated with quadrature LO signals (i.e., LO(I) and LO(Q)) arrive at respective inputs of the mixing DAC 120 at substantially similar arrival times. A clock circuit 114, which includes a phase locked loop (PLL), provides a DDFS clock signal ($f_{DDFS}$) to the DDFS 116 and a synchronization clock signal ($f_{sync}$) to the synchronization circuit 118. As is depicted, the receiver 100 includes an RF attenuator 104 that receives a TV signal from an antenna 102. An attenuation provided by the attenuator 104 is controlled by an RF automatic gain control (AGC) loop 156 such that strong incoming signals are adequately attenuated to avoid non-linearities (e.g., clipping) in an RF front-end, which includes low noise amplifier (LNA) 108 and the mixing DAC 120, etc. In general, the attenuator 104 should have a relatively low insertion loss such that it does not significantly impact noise figure performance of the receiver 100. The RF attenuator 104 may be implemented using, for example, an off-chip pin diode.

An output of the RF attenuator 104 is coupled to an input of a balun 106, which converts a signal at the output of the RF attenuator 104 into a differential signal, which is provided to a differential input of the LNA 108. In general, the balun 106 should have a relatively low insertion loss and a relatively good output amplitude and phase matching in order to minimize common mode to differential coupled noise/spur conversion at the input of the receiver 100. A 1 to N, e.g., a 1 to 2, balun can be used to provide gain in the signal path and, thus, reduce a noise contribution of active circuits in the receiver 100. While a balun cannot provide power gain, i.e., it is a passive circuit, a balun can provide an impedance value change, e g., from 75 Ohms to 300 Ohms in a 1 to 2 balun. By changing the reference impedance level, the noise figure of the receiver 100 may be improved.

The LNA 108 may be configured to have a programmable gain in discrete steps that is set by the RF AGC loop 156. In general, the LNA 108 should be designed to ensure good matching to the balun 106 output impedance. Outputs of the LNA 108 are respectively coupled to inputs of a programmable harmonic reject filter 110, which is configured to improve harmonic rejection performance of the receiver 100. At lower channel frequencies, e.g., in the VHF band, a low-pass filter may be employed to increase the blocker rejection of the LO harmonic frequencies, e.g., 2LO, 3LO, 4LO, etc. At higher channel frequencies, e.g., in the UHF band, a high-pass filter may be employed to reject harmonic distortion components generated by the LNA 108. When no harmonic issues exist, the filter 110 may be switched to an all-pass filter, such that the filter 110 does not degrade the noise figure performance of the receiver 100. It should be appreciated that the filter 110 may be realized as either a passive or an active filter. In general, passive filters have lower noise, but also exhibit lower harmonic rejection. In contrast, active filters provide a higher harmonic rejection, but generally exhibit larger noise contribution.

Outputs of the filter 110 are coupled to respective inputs of a mixing DAC 120, which in this case includes a pair of quadrature mixing DACs. The mixing DACs each have two main sub-blocks, i.e., RF transconductance sections 124 and 126 and switching sections (mixers) 128 and 130. The RF transconductance sections may be configured as, for example, RF transconductance DACs. The RF transconductance sections 124 and 126 convert an RF input voltage into an RF current, based on a value of each local oscillator (LO) bit provided by the DDFS 116 In general, a segmented DAC architecture offers a good power/performance compromise Alternatively, a full binary encoded DAC or a full thermometer encoded DAC may be utilized. Typically, a full binary encoded DAC consumes lower power, but also exhibits lower linearity. In contrast, a full thermometer encoded DAC usually has higher linearity, but also requires higher power. In a typical application, the mixers 128 and 130 are configured as an array of switching pairs (Gilbert cells) that perform the mixing operation on a bit-by-bit basis. The mixer LO path includes a digital bus that provides a digital encoding, erg., binary, thermometer, or segmented, of an instantaneous LO sampled sine wave to inputs of the mixers 128 and 130.

In general, the harmonic rejection of a mixing DAC depends both on the linearity of the RF transconductance section and on synchronization of DDFS control bit arrival times at the LO inputs of the mixers. As mentioned above, the outputs of the DDFS 116 are provided to inputs of the synchronization block 118. The DDFS 116 is driven by a first clock signal and the synchronization block 118 is driven by a second clock signals The first and second clock signals may or may not have the same frequency, depending on whether the DDFS 116 is built as a single full-speed core or includes multiple parallel reduced-speed cores. In general, the DDFS clock signal ($f_{DDFS}$) is less important in terms of phase noise and spurs since the LO data is synchronized later in the LO path. However, the second clock signal ($f_{sync}$) usually should have relatively low phase noise and low spurs, as the second clock signal determines the receiver phase noise and may impact the blocking performance of the receiver 100. The outputs of the mixers ($MIX_I$ and $MIX_Q$) 128 and 130 are provided to a poly-phase filter (PPF) 122, e.g., a fifth-order PPF, that ensures a relatively high value image rejection level over a relatively wide intermediate frequency (IF) range that covers, for example, multiple TV standards, e.g., 33 MHz to 60 MHZ for Europe, USA, and Asian compliant TV receivers. The PPF 122 also performs complex-to-real conversion of the IF signal.

Outputs of the PPF 122 are coupled to respective inputs of bandpass filter 132. The bandpass filter 132 is implemented in the IF path in order to improve blocking performance of the receiver 100 and to lessen (or avoid) detection of blocker power by peal detector 144. The bandpass filter 132 may be implemented using a tuned active stage having an on-chip capacitance and an off-chip inductance that may be selected based on the TV standard. Outputs of the bandpass filter 132 are coupled to respective inputs of a programmable gain amplifier (PGA) 134 that sets the receiver 100 gain at a desired value based on the application, e.g., cable or terrestrial TV. As is depicted, an analog receiver path includes a surface acoustic wave (SAW) driver 136 that drives an off-chip SAW filter 142, whose output is coupled to an analog demodulator (not shown). An amplitude of a signal at the output of the driver 136 should generally be at least about 3 mV to ensure proper operation of an IF AGC loop. A digital receiver path includes a SAW driver 138 that drives an off-chip SAW filter 140, whose output is coupled to an input of an IF variable gain amplifier (VGA) 146. An output of the VGA 146 is coupled to an input of driver 148, whose output is coupled to an input of an off-chip SAW filter 150, whose output is coupled to an input of a digital demodulator (not shown). To reduce the cost of the receiver 100, the SAW filter 150 may be omitted and in this case the driver 148 would directly drive the digital demodulator.

In a typical analog/digital RF receiver, a digital demodulator does not include a built-in IF AGC loop. Thus, for digital TV applications, an additional 50 to 65 decibel (dB) gain is usually required, depending on SAW filter insertion loss, to provide a desired amplitude at an analog-to-digital converter (ADC) input of the digital demodulator. In this embodiment, the VGA 146 is employed to provide a desired gain and gain range. To avoid clipping of the signals at the RF front-end and at an output of IF path SAW driver 138, a dual RF/IF AGC loop may be implemented. In this case, a gain of both the RF attenuator 104 and the LNA 108 are set by the AGC loop 156, based on a power level sensed by an RF root mean square (RMS) detector 158 and peak signal level sensed by the IF peak detector 144 (at the SAW driver 138 output). A variable AGC trip point can be set via a digital control interface circuit 152, which also sets the gain in the IF path and control parameters for the clock circuit 114 and the DDFS 116. A bias circuit 154 may be employed that utilizes a high precision external resistor ($R_{ext}$) to accurately set bias current and voltage levels required for proper operation of the receiver 100.

Figure 2:
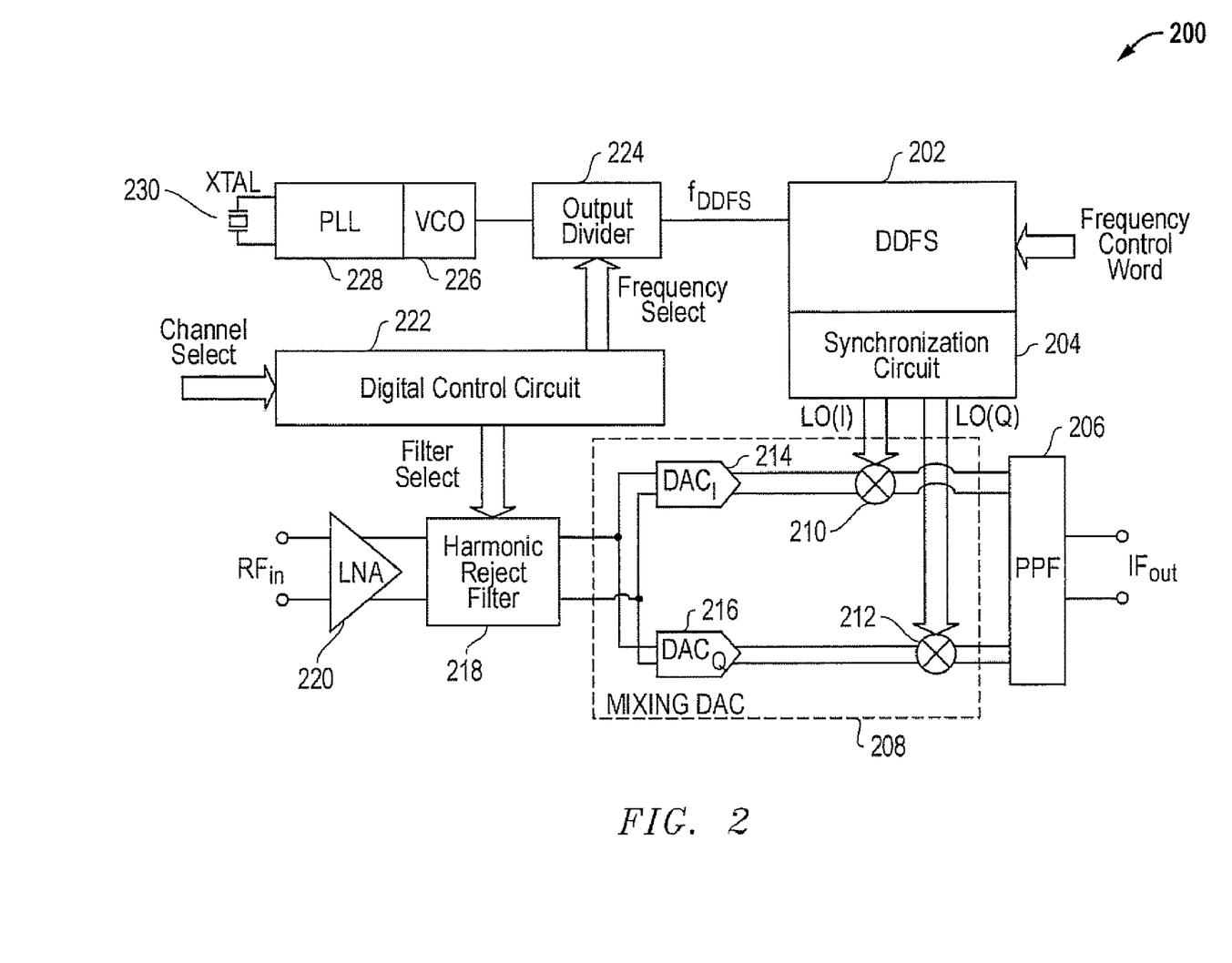
FIG. 2 is an electrical block diagram of a relevant portion of an RF receiver that is configured to provide a variable frequency direct digital frequency synthesizer (DDFS) clock signal ($f_{DDFS}$) based on a selected channel, according to an embodiment of the present invention.

With reference to FIG. 2, a relevant portion of a broadband RF receiver 200 is depicted that is designed to exhibit reduced power consumption through the implementation of a variable frequency direct digital frequency synthesizer (DDFS) clock signal ($f_{DDFS}$), whose frequency is based on a selected channel. As is shown, the receiver 200 includes a low noise amplifier (LNA) 220, whose differential inputs receive an RF input signal ($RF_{in}$). Differential outputs of the LNA 220 are coupled to respective inputs of a harmonic reject filter 218, which may be configured in a manner similar to the filter 110 of FIG. 1. Outputs of the filter 218 are coupled to inputs of an in-phase RF transconductance section 214 and a quadrature RF transconductance section 216. The RF transconductance sections 214 and 216 may be implemented as RF transconductance DACs. Outputs of the RF transconductance section 214 are coupled to inputs of switching section (mixer) 210, whose control inputs receive bits corresponding to an in-phase LO signal. Outputs of the RF transconductance section 216 are coupled to inputs of switching section (mixer) 212, whose control inputs receive bits corresponding to a quadrature LO signal. The RF transconductance sections 214 and 216 and the mixers 210 and 212 are included within a mixing DAC 208. Outputs of the mixers 212 and 210 are coupled to respective inputs of a poly-phase filter (PPF) 206.

As is shown, a digital control circuit 222 receives, at an input, a channel select signal and responsive to the channel select signal provides a frequency select signal to output divider 224 and a filter select signal to an input of the filter 218. The frequency select signal causes the output divider 224 to provide a DDFS clock signal ($f_{DDFS}$), whose frequency is based on a selected channel, to a clock input of DDFS 202, whose outputs provide the quadrature LO signals to inputs of a synchronization circuit 204, which provides similar functionality as the synchronization circuit 118 of FIG. 1. Similarly, the filter select signal causes the filter 218 to assume a configuration, e.g., low-pass, high-pass or all-pass, that is based on the selected channel. As is shown, the output divider 224 is coupled between an output of a fixed-frequency voltage controlled oscillator (VCO) 226, whose output is stabilized by a phase locked loop (PLL) 228, whose frequency is dependent upon crystal 230. In this case, the PLL 228 time constant, bandwidth, and damping factor are usually constant over the entire TV spectrum. The VCO 226 may be implemented using an inductor capacitor (LC) architecture, due to the good phase noise performance of the LC architecture As is well known, the Nyquist theorem requires that a signal be sampled at a frequency that is at least two times the frequency of the signal In the usual case, with some margin built-in, a DDFS clock frequency of an RF receiver may be set to between 2 and 3 GHz, which is high enough for the highest TV channel, e.g., 860 MHz, and the highest IF frequency, e.g., 60 MHz. Unfortunately, operating a DDFS at GHz frequencies results in relatively large power dissipation. Furthermore, using most conventional complementary metal-oxide semiconductor (CMOS) processes, it may be difficult to design a DDFS that operates at 2 to 3 GHz. In this case, multiple DDFS cores may be employed that operate at a lower frequency clock signal. In this configuration, outputs of the multiple DDFS cores are multiplexed and serialized to provide data streams to inputs of mixers of a mixing DAC at the DDFS clock frequency. From a sampling point of view, a frequency of the DDFS clock signal can be decreased with the LO sine wave frequency. Thus, for example, to provide a local oscillator (LO) frequency ($f_{LO}$) equal to 70 MHz, a frequency of a DDFS clock signal can theoretically be as low as 150 to 170 MHz.

Figure 3:
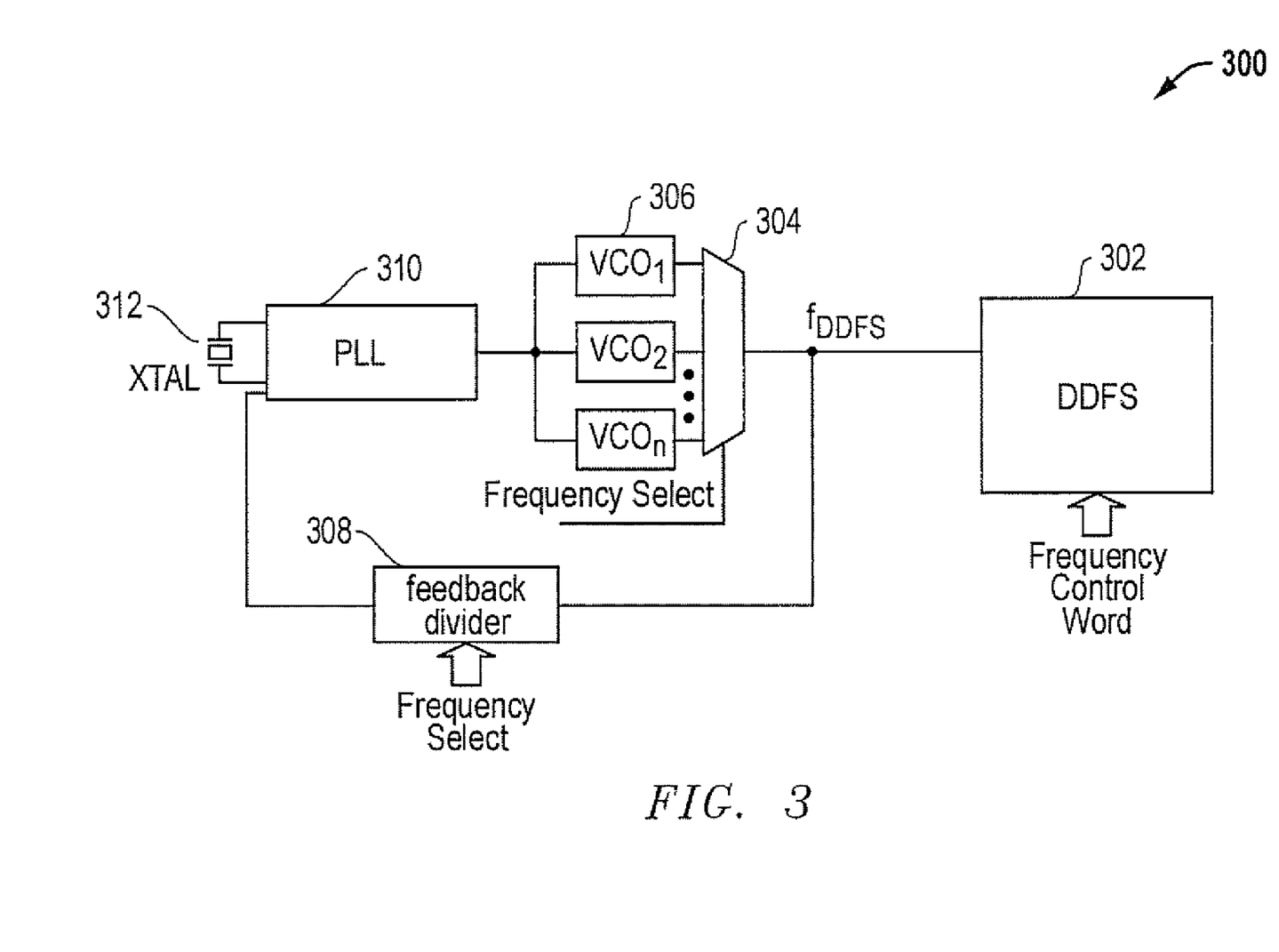
FIG. 3 is an electrical block diagram of a relevant portion of an RF receiver that is configured to provide a variable frequency DDFS clock signal ($f_{DDFS}$) based on a selected channel, according to another embodiment of the present invention.

With reference to FIG. 3, a relevant portion of a frequency synthesizer 300 for an RF receiver is illustrated that exhibits a relatively low phase noise, small frequency step, and large frequency variation in a direct digital frequency synthesizer (DDFS) clock signal. In this case, multiple VCOs 306, each of which are centered around a frequency of interest, are employed in conjunction with a phase locked loop (PLL) 310 and a variable feedback divider 308. In a typical case, using a lower frequency DDFS clock signal results in significant reduction in power consumption for an RF receiver. However, it should be appreciated that reducing power consumption in this manner comes with increased risk of spur coupling and desensitization of the receiver. That is, if the DDFS operates at a clock frequency that falls inside the TV spectrum, parasitic coupling to the RF front-end may occur. Parasitic coupling can significantly decrease the signal-to-noise ratio (SNR) of the receiver and potentially prevent reception of a desired channel.

As isolation between analog and digital blocks of a mixed-signal integrated circuit (IC) may not be that large, it is generally desirable to use a DDFS clock signal whose frequency is outside the TV band, even when the Nyquist sampling theory allows a lower sampling frequency, e.g., for VHF channels. For example, if a normal frequency for a DDFS clock signal for high UHF channels is 3 GHz, then at lower frequency channels a 2 GHz or a 1 GHz frequency may be employed In this case, it is desirable for a PLL output divider (see FIG. 2) to be a programmable divide by 1, 2, or 3. It should be appreciated that other frequencies and division ratios may also be implemented. Alternatively, for low VHF channels, the DDFS clock frequency may be selected to fall in the gap between the high VHF and UHF bands. Even when the DDFS clock frequencies are outside the TV spectrum, blocking issues may still occur. For example, if the DDFS is operating at 1 GHz and 1 GHz digital noise modulates the power supply of the LO path synchronization circuit, an $f_{LO}$+/– 1 GHz spur may be created on the equivalent DDFS sampled LO sine wave In this case, an $f_{LO}$–1 GHz spur may mix with a blocker signal situated at 1 GHz–$f_{desired}$ which may result in degraded receiver performance. In general, it is desirable to clock the DDFS at a frequency greater than 2*$f_{RFmax}$ (where $f_{RFmax}$ is, for example, a maximum channel frequency in a TV band), which is approximately equal to 1.7 GHz for the TV band. In theory, the power dissipation of the DDFS can be reduced at lower frequency TV channels by using a lower frequency DDFS clock signal. However, in practice, due to the spur coupling issues, the minimum DDFS clock frequency may be limited to about 900 MHz, which still provides some power reduction for the receiver To address coupling between the DDFS and RF front-end, a frequency of the DDFS clock signal may be modified slightly when receiving a TV channel that has a DDFS clock signal falling in-band. In this case, a small change of the PLL feedback divider (see FIG. 3) can provide enough change to the frequency of the DDFS clock signal to move it out of the desired TV channel band. In the usual case the modification needs to be around 5 to 8 MHz which may be achieved even when an LC oscillator with a relatively narrow tuning range is employed. Another issue that should be considered is that even if a frequency of the DDFS clock signal is not in the channel band, the DDFS spur may still be detected by a peak detector utilized in an AGC loop. In this case, attenuation of a desired channel may occur resulting in degradation of a signal-to-noise ratio (SNR) of the desired channel. In a typical case, moving the frequency of the DDFS clock signal by several tens of MHz is more appropriate to substantially prevent an IF AGC peak detector from detecting spur power. In this case, the spur power is substantially attenuated by an IF bandpass filter. It should be appreciated that spurs may still be an issue for the RF AGC. However, parasitic coupling between a DDFS and a front-end may be reduced to a tolerable level through careful layout of the receiver and careful layout of chip pins.

In certain cases, changing the DDFS clock frequency based on a frequency of a generated LO signal may not provide a desired power reduction. According to another aspect of the present invention, lower power dissipation may be achieved in a receiver employing a DDFS driven mixing DAC by implementing a standard square wave LO signal (for higher frequency, e.g., UHF, channels) in conjunction with a TV band selector filter that is employed in front of a tuner. In general, the technique may be employed for UHF channels, as UHF channels usually do not have an LO harmonic problem, as the LO harmonics are out-of-band where no strong blockers exist. A mixing DAC that is driven by the DDFS with a fifty percent duty cycle, i.e., all ones followed by all zeros, in general operates substantially the same as a standard square wave mixer.

Figure 4:
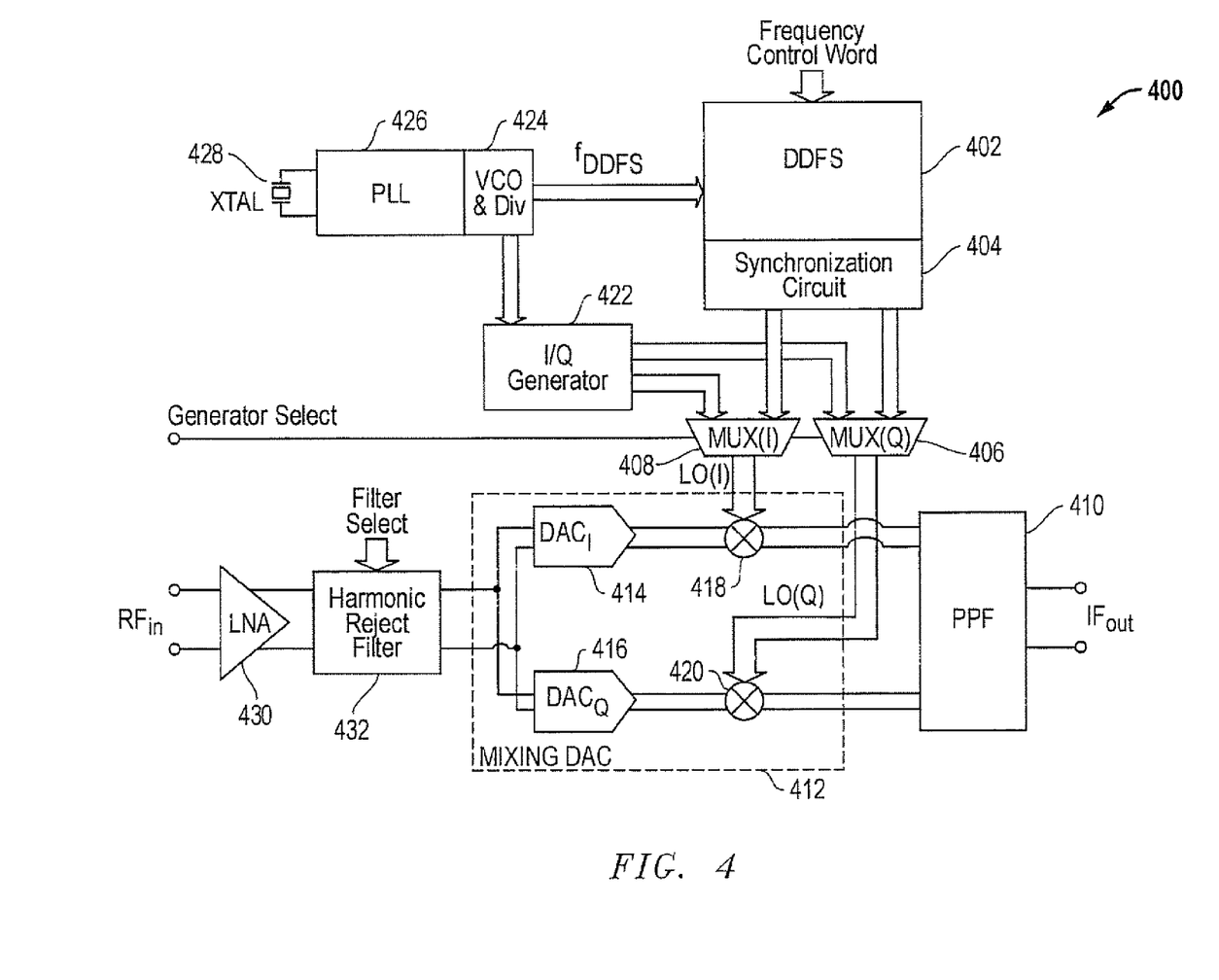
FIG. 4 is an electrical block diagram of a relevant portion of an RF receiver that is configured to selectively provide a local oscillator (LO) signal from a DDFS or an in-phase/quadrature (I/Q) generator based on a selected channel, according to an embodiment of the present invention.

Turning to FIG. 4, an RF receiver 400 that implements an in-phase/quadrature (I/Q) generator 422, in conjunction with a direct digital frequency synthesizer (DDFS) 402, is illustrated. In this embodiment, the generator 422 provides a square wave LO signal and the DDFS 402 provides a sampled sine wave LO signal. The receiver 400 includes a crystal 428 that provides a reference frequency (e.g., 24 MHz) for phase locked loop (PLL) 426. The PLL 426 is coupled to a voltage controlled oscillator (VCO) 424, which includes a divider (e.g., an output divider or a feedback divider). The VCO 424 provides a fixed frequency DDFS clock signal ($f_{DDFS}$) to the DDFS 402 and provides a variable frequency clock signal to the I/Q generator 422. Outputs of the DDFS 402 provide in-phase (I) and quadrature (Q) LO signals to second inputs of multiplexers 408 and 406, respectively, via synchronization circuit 404, which ensures substantially similar bit arrival times at respective inputs of switching sections (mixers) 418 and 420 for bits associated with the LO signals. Outputs of the generator 422 provide in-phase (I) and quadrature (Q) LO signals to first inputs of the multiplexers 408 and 406, respectively. Outputs of the multiplexers 408 and 406 are respectively coupled to first inputs of the mixers 418 and 420 of mixing DAC 412. Second inputs of the mixers 418 and 420 are coupled to RF transconductance sections 414 and 416, respectively. Inputs of the RF transconductance sections 414 and 416 are coupled to respective outputs of a harmonic reject filter 432, whose inputs are coupled to a differential output of a low noise amplifier (LNA) 430, whose differential input receives an RF input signal.

In one embodiment, the I/Q generator 422 provides square wave LO signals for UHF channels and the DDFS 402 provides sampled sine wave LO signals for non-UHF channels To simplify receiver design, the square wave LO signals for the UHF channels can also be generated directly by the DDFS 402. Assuming a DDFS over-samples a sine wave at a relatively high rate, the receiver power can be further reduced by recognizing that different channels have a different order of LO blocking. For example, in a TV receiver that employs high-side mixing and has a lowest TV channel at 56 MHz and an intermediate frequency (IF) of 33 MHz, an LO frequency of 89 MHz is required. This LO frequency has in-band harmonics up to ninth-order, i.e., 2LO, 3LO, 4LO, 5LO, 6LO, 7LO, 8LO, and 9LO. In contrast, a higher TV channel that uses an LO frequency of 200 MHz only has LO harmonic issues up to fourth-order and a TV channel that uses an LO frequency of 300 MHz only has harmonic issues up to second-order.

Figure 5:
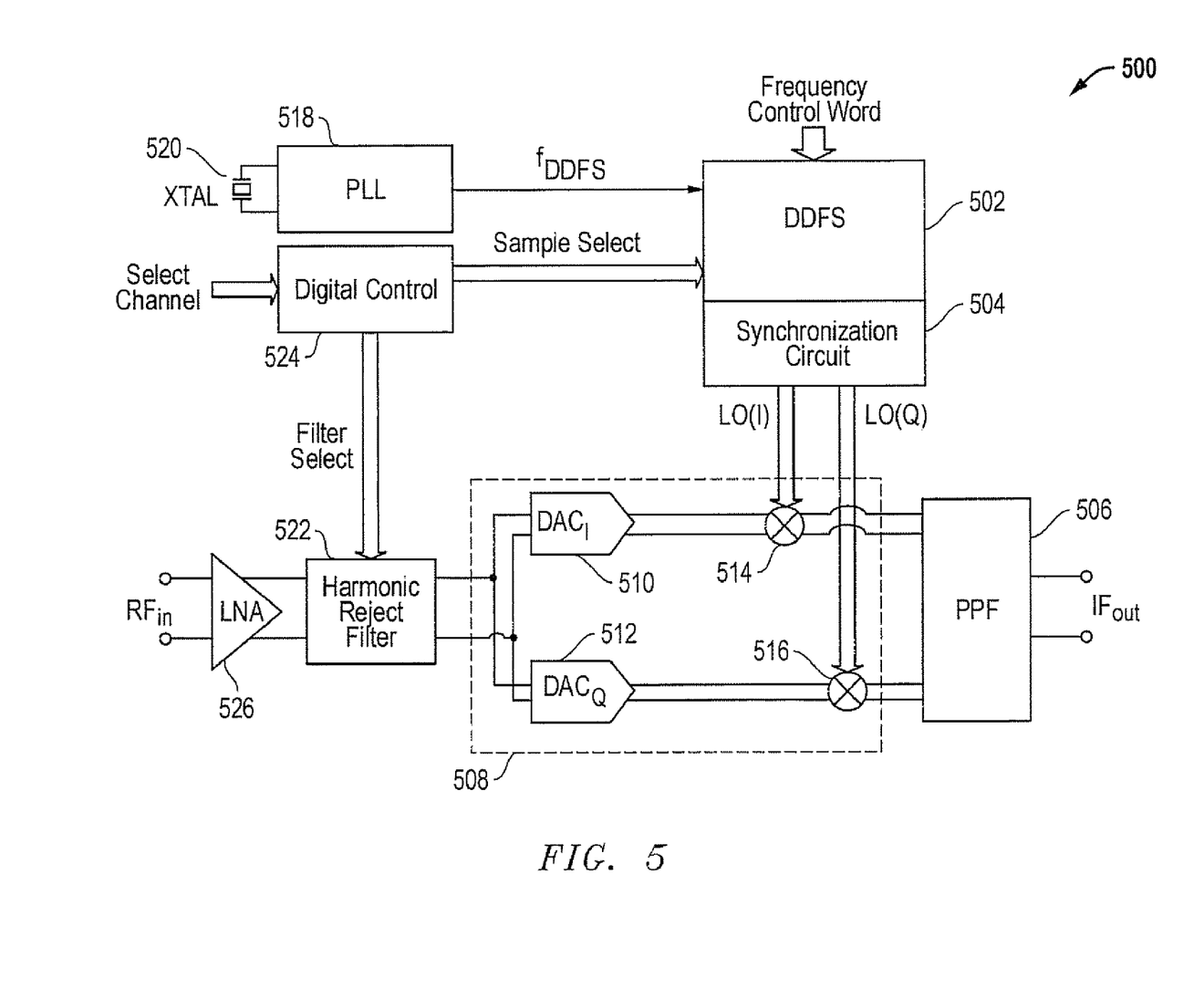
FIG. 5 is an electrical block diagram of a relevant portion of an RF receiver that is configured to selectively provide a LO signal having a selected number of samples based on a selected channel, according to an embodiment of the present invention.

With reference to FIG. 5, an RF receiver 500 that includes a DDFS 502 that provides quadrature LO signals, whose samples are dependent upon a selected channel, is illustrated. The receiver 500 includes a crystal 520 that provides a reference frequency for phase locked loop (PLL) 518. The PLL 518 provides a fixed frequency DDFS clock signal to a clock input of the DDFS 502. Outputs of the DDFS 502 provide in-phase (I) and quadrature (Q) LO signals to first inputs of switching sections (mixers) 514 and 516, respectively, via synchronization circuit 504 which ensures substantially similar arrival times at respective inputs of the mixers 514 and 516 for bits associated with the LO signals. Second inputs of the mixers 514 and 516 are coupled to outputs of RF transconductance sections 510 and 512, respectively. Inputs of the RF transconductance sections 510 and 512 are coupled to outputs of a harmonic reject filter 522, whose inputs are coupled to respective outputs of a low noise amplifier (LNA) 526, whose inputs receive an RF input signal.

According to this aspect of the present invention, a sampled sine wave with equally spaced samples may be employed to provide a different amount of LO harmonic rejection for a mixing DAC. For example, using a six-point sampled LO signal yields a mixing DAC that rejects third-order and fifth-order harmonics. A sine wave LO signal with eight sample points yields a mixing DAC that rejects third-order, fourth-order, and fifth-order harmonics. As another example, a sampled sine wave LO signal having twelve sample points yields a mixing DAC that rejects second-order, third-order, fourth-order, fifth-order, and sixth-order LO harmonics. As yet another example, a sampled sine wave LO signal having sixteen sample points yields a mixing DAC that rejects LO harmonics from second-order to ninth-order.

Figure 6:
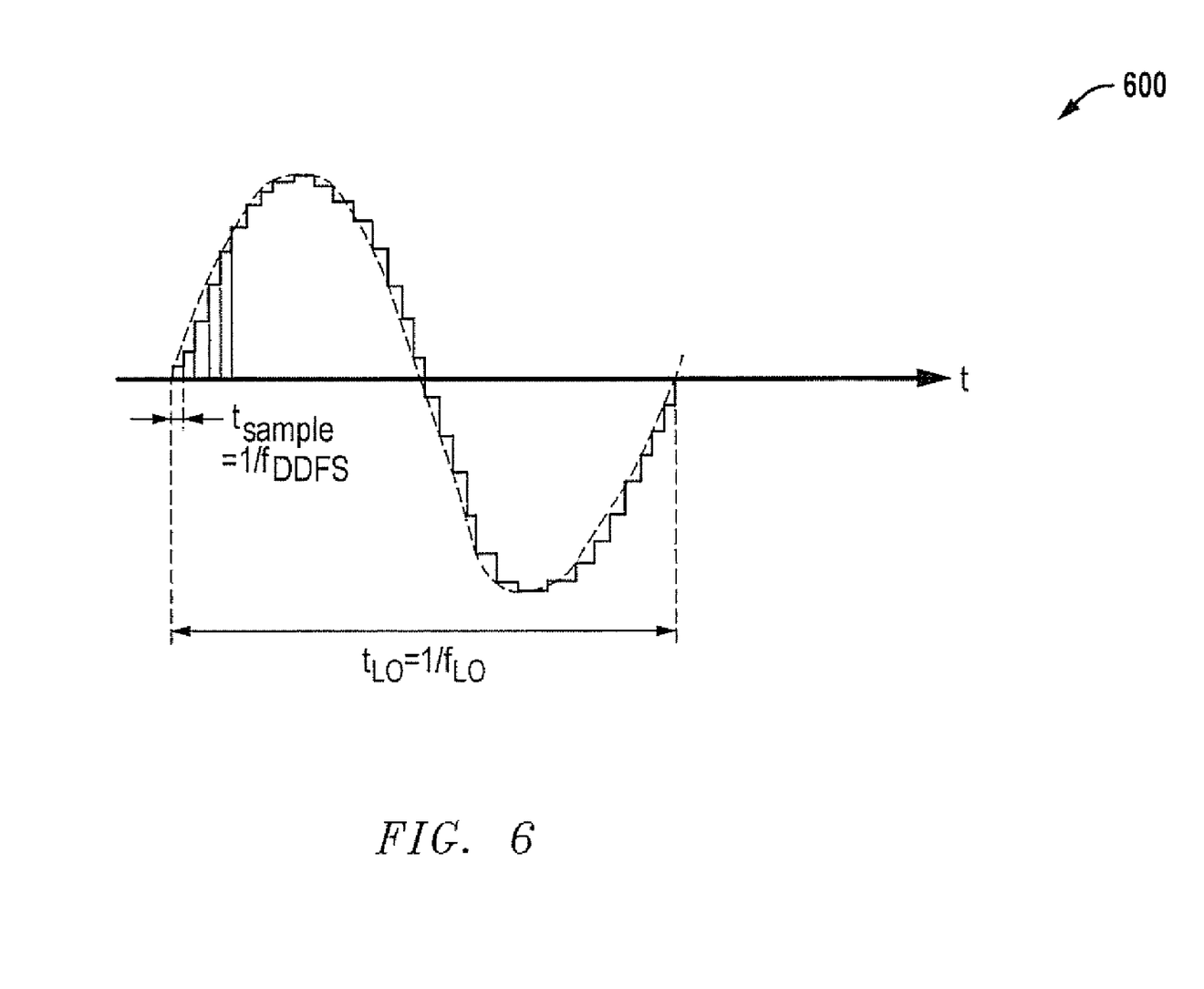
FIG. 6 is a signal diagram of a sampled sinusoidal waveform using a full resolution mixing DAC.

Moving to FIG. 6, signal diagram 600 depicts a sampled LO sine wave signal generated by, for example, a direct digital frequency synthesizer (DDFS) employed in conjunction with a mixing DAC architecture. If a frequency of a DDFS clock signal is selected to be greater than $2*f_{LOmax}$, then for all TV channels the high frequency spurious tones generated by sine wave sampling are out-of-band (i.e., out of the TV spectrum) where no strong blockers exist, or the blockers may be rejected by a front-end TV band selector filter. However, the high frequency spurious tones of the sampled LO signal may down convert white noise situated at $f_{IF}$ lower than $f_{LO}$. This down-converted noise degrades the mixing DAC noise figure performance at high UHF channels The higher the frequency of the DDFS clock signal ($f_{DDFS}$), the lower the amplitude of the sampled sine wave high frequency tones and, therefore, the lower the mixer noise degradation. However, a higher DDFS clock frequency results in a higher power dissipation. In sum, a noise-power compromise is usually desirable in sampled mixing DAC architecture designs. Typically, to avoid significant mixer noise performance degradation, the frequency of the DDFS clock signal ($f_{DDFS}$) should be at least three times the generated LO frequency. This constraint should be taken into account in the implementation of reduced power mixing DAC architectures that utilize a lower DDFS clock frequency for power reduction.

A lower $f_{DDFS}/f_{LO}$ ratio results in a reduction of the main LO frequency ($f_{LO}$) tones due to the sinc effect shaping. In general, this results in further reduction of the mixing DAC gain below the ideal gain of $G_{MIXER}=(gm/2)R_{OUT}$, where gm is the total transconductance of the RF transconductance section and $R_{OUT}$ is the mixer output impedance. As a mixing DAC emulates a sinusoid mixer, the gain of a mixing DAC is lower than that provided by a standard square wave mixer, whose gain is given by: $G_{MIXER(SQUARE\ WAVE)}=(gm)R_{OUT}(4/\pi)$. Since a mixing DAC has a lower gain for the same transconductance (gm) and $R_{OUT}$ values, the mixing DAC reflects more of the IF block noise to the receiver input. As such, for similar IF block performance, a higher gain LNA is required in a receiver employing a mixing DAC.

Figure 7:
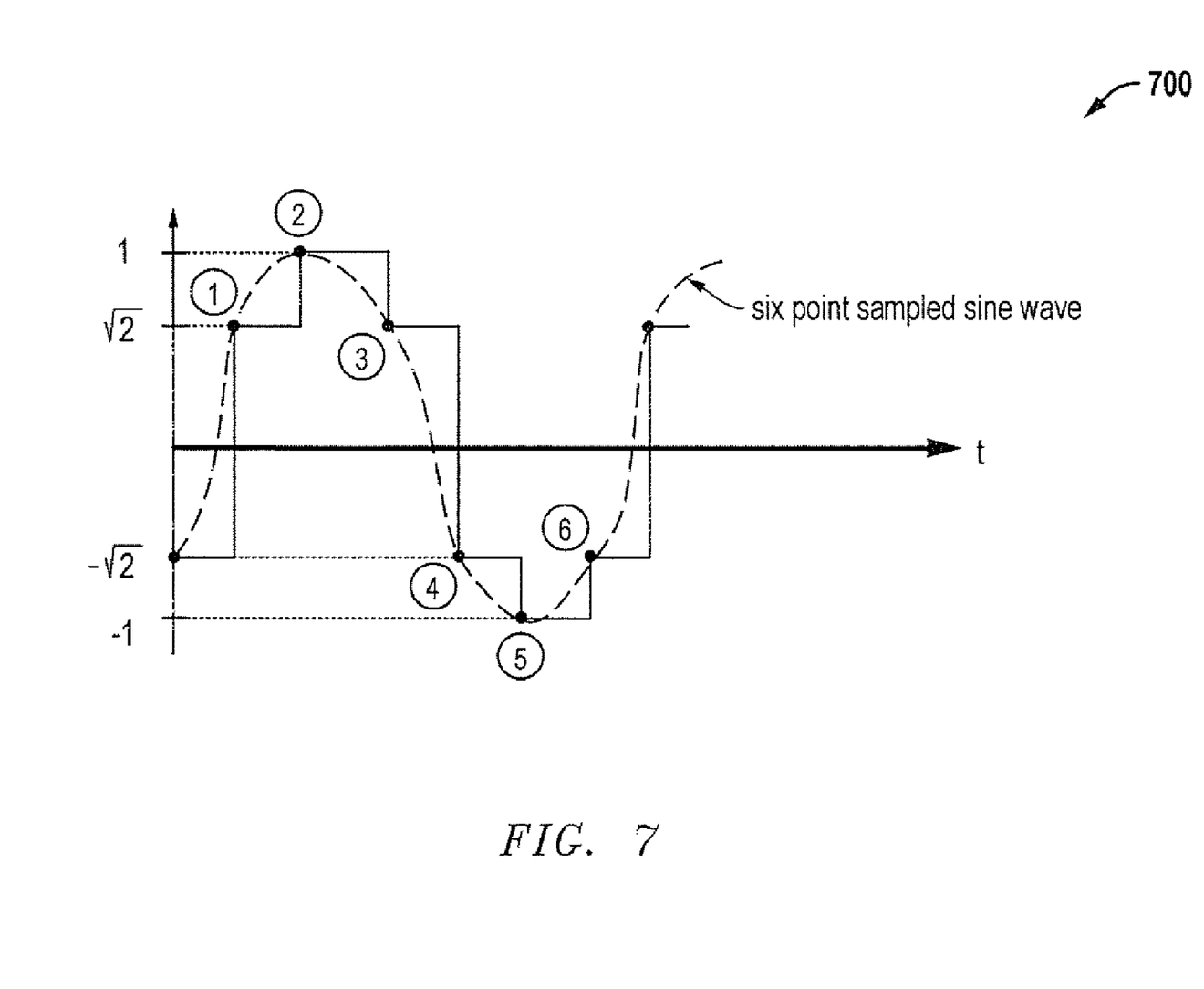
FIG. 7 is a signal diagram of a six-point sampled sine wave.
Figure 8:
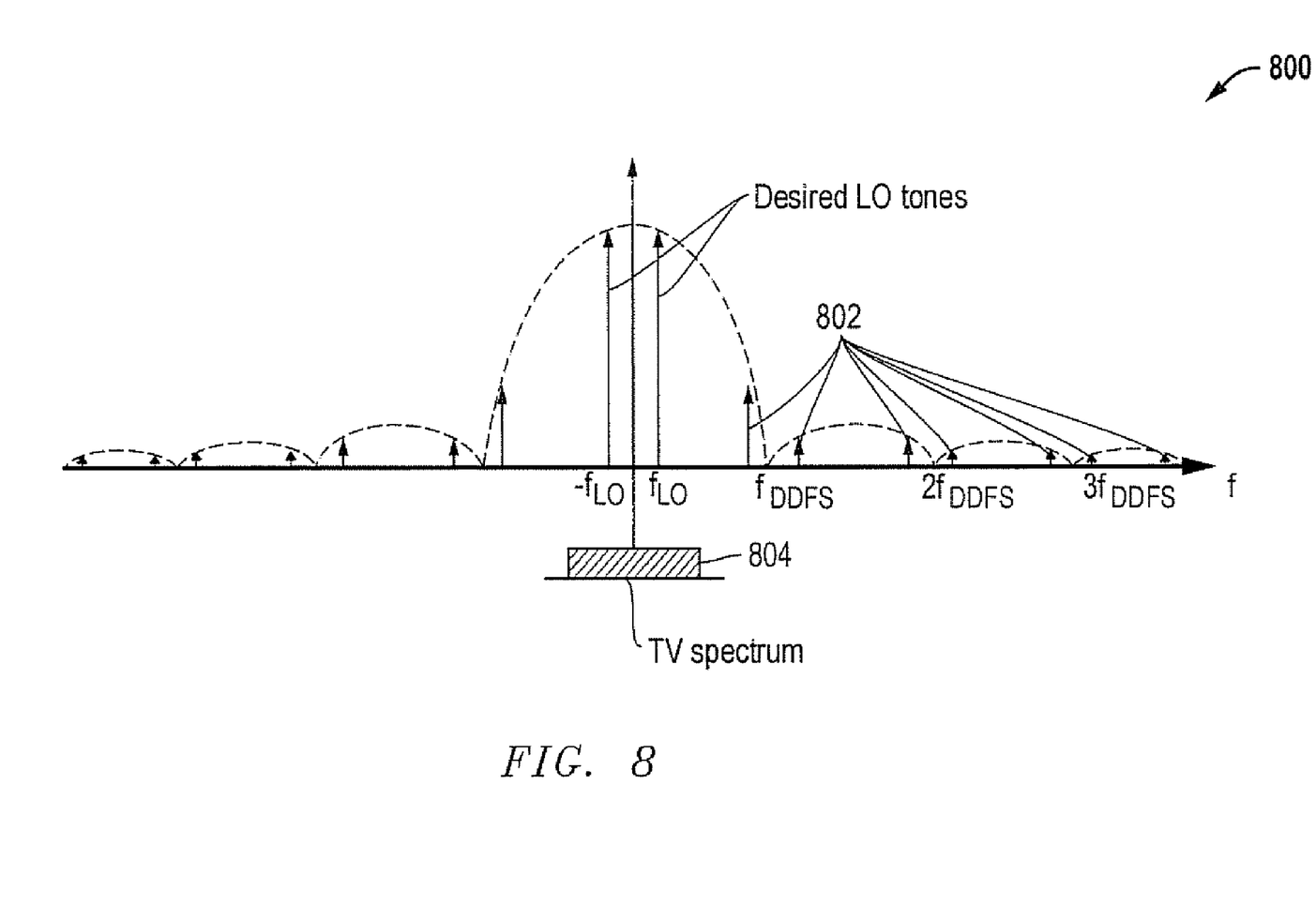
FIG. 8 is a signal diagram that illustrates desired LO tones and a number of high-frequency spurs that may be associated with an RF receiver using a full resolution mixing DAC.
Figure 9:
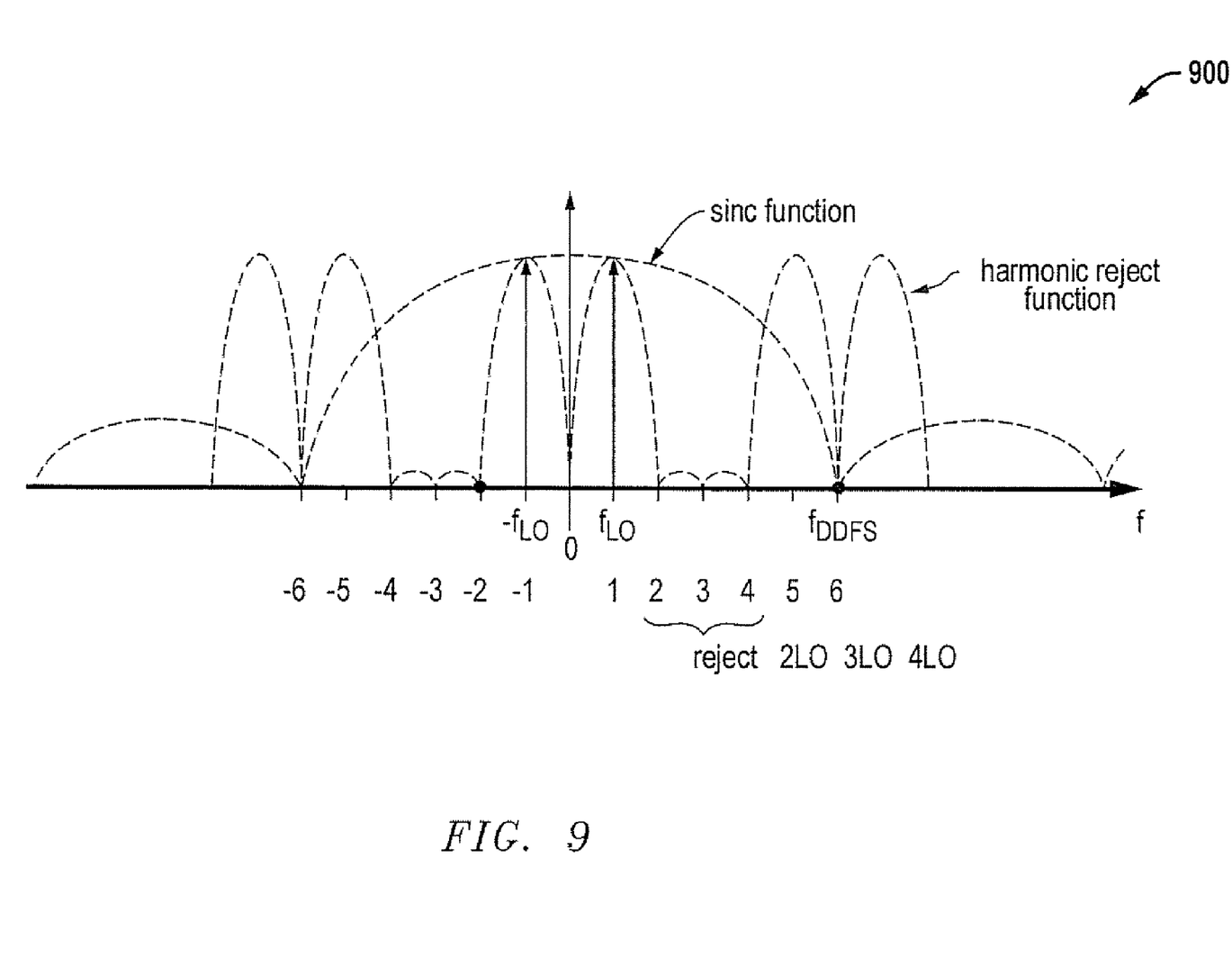
FIG. 9 is a signal diagram that illustrates desired LO tones and a number of LO harmonics that may be associated with an RF receiver using a reduced resolution mixing DAC that achieves harmonic rejection.

With reference to FIG. 7, a signal diagram 700 illustrates a sampled LO signal that uses only six sampling points and is capable of rejecting second-order, third-order, and fourth-order harmonics. In general, a six-point sampled sine wave LO signal is adequate for frequencies higher than 172 MHz, as there are no harmonics higher than fourth-order in the TV spectrum, e.g., from about 40 MHz to about 860 MHz. In this implementation, the digital circuit that sets the reception to a given TV channel may also select the type of waveform to be used by the DDFS. For low VHF channels, a sixteen-point sampled sine wave LO signal may be used to reject up to ninth-order harmonics. At higher VHF channels, the number of sample points may be progressively decreased to four sample points which still achieves good second-order LO harmonic rejection. For UHF channels, a two sample point square wave LO signal provides good results, as all the LO harmonics are out-of-band The sampling technique may employ a constant frequency DDFS clock signal or may be combined with a variable frequency DDFS clock signal approach to provide further power consumption reduction In general, an optimum mixing DAC design should consider gain reduction, noise, and spurious tone issues when implementing a lower DDFS clock frequency. Turning to FIG. 8, a frequency domain signal diagram 800 associated with a DDFS driven mixing DAC is depicted In this case, all of the LO signal high frequency spurs 802 ($f_{DDFS}$+/− $f_{LO}$, 2$f_{DDFS}$+/− $f_{LO}$, 3$f_{DDFS}$+/− $f_{LO}$, etc.) are out of the TV band 804 and, as such, do not degrade the noise figure of an associated RF receiver. With reference to FIG. 9, a frequency domain diagram 900, of a finite sampled sine wave, illustrates LO harmonics within an associated sinc function.

Accordingly, a reduced power direct digital frequency synthesizer (DDFS) driven mixing DAC that employs a variable DDFS clock frequency has been disclosed herein. At lower frequency TV channels, a lower frequency DDFS clock signal may be employed to reduce power dissipation of the DDFS. A reduced power DDFS driven mixing DAC may implement square wave LO signals for UHF TV channels that do not have LO harmonic issues and a constant rate sampled LO signal for VHF TV channels that have LO harmonic issues A reduced power DDFS mixing DAC architecture may also implement a variable number of LO sine wave signal sample points to reject, based on the LO frequency range, an adequate order of LO harmonics The above-disclosed subject matter is to be considered illustrative, and not restrictive, and the appended claims are intended to cover all such modifications, enhancements, and other embodiments that fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A receiver, comprising:
a mixing digital-to-analog converter (DAC), comprising:
a radio frequency (RF) transconductance section having an input configured to receive an RF signal and an output configured to provide an RE current signal; and
a switching section coupled to the RF transconductance section, the switching section having inputs configured to receive bits associated with a digital local oscillator (LO) signal and having an output, wherein the switching section is configured to mix the RF current signal with the digital LO signal to provide an analog output signal at the output of the switching section;
a direct digital frequency synthesizer (DDFS) having outputs configured to provide the bits associated with the digital LO signal and having a first clock input configured to receive a first clock signal that sets a sample rate for the digital LO signal; and
a clock circuit configured to provide the first clock signal to the first clock input of the DDFS, wherein a frequency of the first clock signal is based on a selected channel.

2. The receiver of claim 1, wherein the clock circuit further comprises:
a phase locked loop (PLL) having an output;
a voltage controlled oscillator (VCO) having an input coupled to the output of the PLL; and
an output divider coupled between an output of the VCO and the first clock input of the DDFS, wherein a value of the output divider is selected based on the selected channel, and wherein the frequency of the first clock signal is based on the value of the output divider and a VCO frequency provided at the output of the VCO.

3. The receiver of claim 1, wherein the clock circuit further comprises:
a phase locked loop (PLL) having an output;
multiple voltage controlled oscillators (VCOs) each having an input coupled to the output of the PLL;
a multiplexer including multiple inputs and an output, wherein a respective one of the multiple inputs is coupled to an output of a respective one of the multiple VCOs; and
a feedback divider coupled between the output of the multiplexer and an input of the PLL, wherein a value of the feedback divider is set based on the selected channel, and wherein the multiplexer is configured to selectively couple the output of one of the VCOs to the first clock input of the DDFS based on the selected channel and the frequency of the first clock signal is based on the value of the feedback divider and a VCO frequency provided by a selected one of the multiple VCOs.

4. The receiver of claim 1, further comprising:
a signal generator having outputs configured to provide the bits associated with the digital LO signal based on a square wave signal; and
a multiplexer having first inputs coupled to the outputs of the DDFS, second inputs coupled to the outputs of the signal generator, and outputs coupled to the inputs of the switching section, wherein the multiplexer is configured to selectively couple the outputs of the DDFS or the outputs of the signal generator to the inputs of the switching section based on the selected channel, and wherein the DDFS provides the digital LO signal based on a sampled sine wave signal.

5. The receiver of claim 1, wherein the digital LO signal is based on a sampled sine wave signal or a square wave signal responsive to the selected channel.

6. The receiver of claim 1, wherein the mixing DAC includes quadrature mixing DACs configured to, respectively, provide an in-phase (I) output signal and a quadrature (Q) output signal.

7. The receiver of claim 1, wherein the digital LO signal is based on a sampled sine wave signal whose number of samples is based on the selected channel.

8. The receiver of claim 7, wherein the number of the samples in the sampled sine wave signal is increased for at least some lower frequency channels.

9. The receiver of claim 1, wherein the frequency of the first clock signal is outside a television (TV) band.

10. The receiver of claim 1, wherein the frequency of the first clock signal is within a television (TV) band and outside a desired channel band.

11. A receiver, comprising:
a mixing digital-to-analog converter (DAC), comprising:
a radio frequency (RF) transconductance section having an input configured to receive an RF signal and an output configured to provide an RF current signal; and
a switching section coupled to the RF transconductance section, the switching section having inputs configured to receive bits associated with a digital local oscillator (LO) signal and having an output, wherein the switching section is configured to mix the RF current signal with the digital LO signal to provide an analog output signal at the output of the switching section;
a direct digital frequency synthesizer (DDFS) having outputs configured to provide the bits associated with the digital LO signal and having a first clock input configured to receive a first clock signal that sets a sample rate for the digital LO signal; and a clock circuit configured to provide the first clock signal to the first clock input of the DDFS, wherein the digital LO signal is based on a sampled signal whose number of samples is based on a selected channel.

12. The receiver of claim 11, wherein the sampled signal is a sampled sine wave signal or a sampled square wave signal.

13. The receiver of claim 11, wherein a frequency of the first clock signal is based on the selected channel.

14. The receiver of claim 11, wherein the number of the samples in the sampled signal is increased for at least some lower frequency channels.

15. The receiver of claim 11, wherein a frequency of the first clock signal is outside a television (TV) band.

16. The receiver of claim 11, wherein a frequency of the first clock signal is within a television (TV) band and outside a desired channel band.

17. A method of reducing power consumption of a receiver, comprising:

receiving, at a first input of a mixing digital-to-analog converter (DAC), a radio frequency (RF) signal, wherein the first input is associated with an RF transconductance section of the mixing DAC;

setting a frequency of a first clock signal based on a selected channel;

clocking a direct digital frequency synthesizer (DDFS) with the first clock signal, the DDFS providing a digital local oscillator (LO) signal based, at least in part, on the first clock signal, the first clock signal providing a sample rate for the digital LO signal; and receiving, at second inputs of the mixing DAC, bits of the digital LO signal, wherein the second inputs are associated with a switching section of the mixing DAC.

18. The method of claim 17, further comprising:

selecting whether the digital LO signal is based on a sampled sine wave signal or a square wave signal responsive to the selected channel.

19. The method of claim 18, wherein the number of the samples in the sampled sine wave signal is increased for at least some lower frequency channels.

20. The method of claim 17, wherein the digital LO signal is based on a sampled sine wave signal whose number of samples is based on the selected channel.

* * * * *

UNITED STATES PATENT AND TRADEMARK OFFICE
CERTIFICATE OF CORRECTION

PATENT NO. : 7,599,676 B2  Page 1 of 1
APPLICATION NO. : 11/669769
DATED : October 6, 2009
INVENTOR(S) : Adrian Maxim It is certified that error appears in the above-identified patent and that said Letters Patent is hereby corrected as shown below:

In column 1, line 25, insert --.-- after "linearity".

In column 1, line 29, insert --.-- after "signal".

In column 1, line 58, insert --.-- after "output".

In column 2, line 7, change "REF" to --RF--.

In column 11, line 42, change "RE" to --RF--.

Signed and Sealed this

Seventh Day of September, 2010

David J. Kappos
*Director of the United States Patent and Trademark Office*